(12) United States Patent
Kim et al.

(10) Patent No.: US 8,565,606 B2
(45) Date of Patent: Oct. 22, 2013

(54) SYSTEM AND METHOD FOR ACQUIRING DATA OF MULTI-CHANNEL SQUID SIGNAL

(75) Inventors: Jin Mok Kim, Daejeon (KR); Yong Ho Lee, Daejeon (KR); Hyuk Chan Kwon, Daejeon (KR); Ki Woong Kim, Daejeon (KR); Kwon Kyu Yu, Daejeon (KR)

(73) Assignee: Korea Research Institute of Standards and Science, Yuseong-Gu, Daejeon (KR)

( * ) Notice: Subject to any disclaimer, the term of this patent is extended or adjusted under 35 U.S.C. 154(b) by 167 days.

(21) Appl. No.: 13/204,503

(22) Filed: Aug. 5, 2011

(65) Prior Publication Data

US 2012/0016612 A1 Jan. 19, 2012

Related U.S. Application Data

(63) Continuation of application No. PCT/KR2009/006424, filed on Nov. 3, 2009.

(30) Foreign Application Priority Data

Apr. 22, 2009 (KR) ........................ 10-2009-0035111

(51) Int. Cl.
*H04B 10/2575* (2013.01)

(52) U.S. Cl.
USPC .......................................... 398/110; 398/115

(58) Field of Classification Search
USPC .......................................... 398/110, 115–117
See application file for complete search history.

(56) References Cited

U.S. PATENT DOCUMENTS

| | | | |
|---|---|---|---|
| 5,333,088 A * | 7/1994 | Sweet | 398/110 |
| 2003/0016010 A1* | 1/2003 | Kandori et al. | 324/248 |
| 2003/0114745 A1* | 6/2003 | Amano et al. | 600/409 |
| 2003/0184289 A1 | 10/2003 | Butters | |
| 2004/0183530 A1 | 9/2004 | Butters | |
| 2007/0231872 A1 | 10/2007 | Butters | |
| 2008/0312523 A1* | 12/2008 | Dunseath | 600/383 |
| 2009/0093705 A1* | 4/2009 | Vangdal | 600/410 |

OTHER PUBLICATIONS

International Search Report in PCT/KR2009/006424, dated Jun. 1, 2010.
Written Opinion in PCT/KR2009/006424, dated Jun. 1, 2010.

* cited by examiner

*Primary Examiner* — Leslie Pascal
(74) *Attorney, Agent, or Firm* — Womble Carlyle (57) ABSTRACT

A system for acquiring data of a multi-channel superconducting quantum interference device (SQUID) signal includes a digital converter connected to a SQUID sensor having a plurality of channels and configured to receive a voltage signal output from the plurality of channels and generate a channel-voltage serial digital signal having information about a channel from which the voltage signal is output and information about the voltage signal, and an optical fiber cable through which the channel-voltage serial digital signal is transmitted from the digital converter.

18 Claims, 10 Drawing Sheets

SYSTEM AND METHOD FOR ACQUIRING DATA OF MULTI-CHANNEL SQUID SIGNAL

CROSS-REFERENCE TO RELATED APPLICATIONS

This is a Continuation of International Application No. PCT/KR2009/006424, filed Nov. 3, 2009, and published as WO 2010/123183A1 on Oct. 10, 2010. This application claims priority to and the benefit of Korean Patent Application No. 2009-0035111, filed on Apr. 22, 2009. The contents of the above-identified applications are incorporated by reference in their entirety.

BACKGROUND

1. Field of the Invention

The present invention relates to a data acquisition system, and more particularly to a system and method for acquiring data of a multi-channel superconducting quantum interference device (SQUID) signal.

2. Related Art

A SQUID (Superconducting Quantum Interference Device) is a device that can respond to a small change in magnetic field due to the quantum interference effect of magnetic flux, and is used in high-sensitive fluxmeters or biological sensors for magnetocardiography (MCG) and magnetoencephalography (MEG) measurements.

A SQUID sensor measures a fine magnetic field, and is disposed in a liquid helium Dewar placed in a magnetically shielded room (MSR) or a radio-frequency shielded room (RFSR) to perform MCG or MEG measurement on a human body.

Since a signal sensed by the SQUID sensor is a weak voltage signal, it is amplified and linearized in a flux-locked loop (FLL) circuit and transmitted out of the shield room. The signal coming out of the shield room through wires is signal-processed appropriately for MCG or MEG analysis by an analog signal processor (ASP), and then is transmitted to a data acquisition (DAQ) board and input to a computer.

Figure 1:
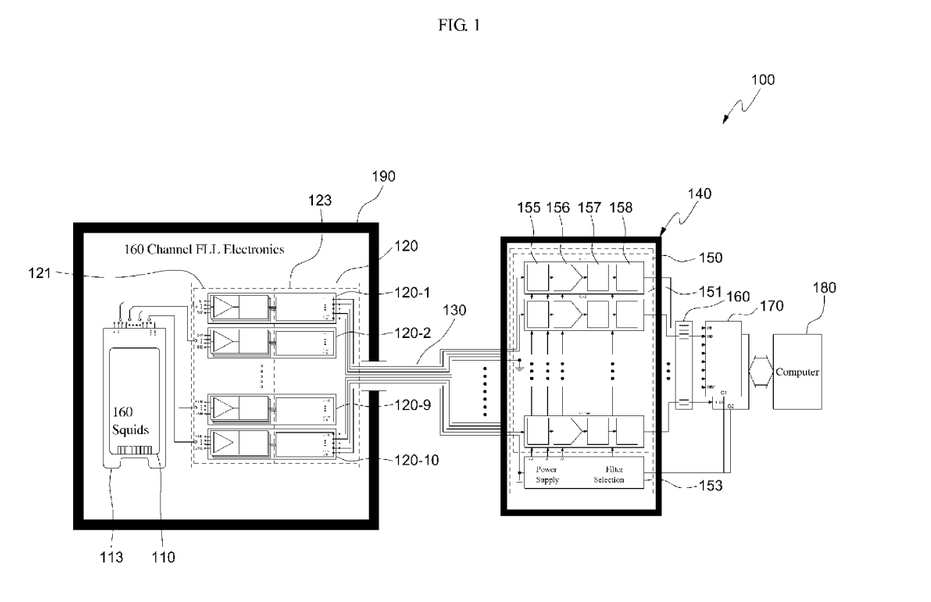
FIG. 1 illustrates a system for acquiring data of a multi-channel superconducting quantum interference device (SQUID) signal using an analog signal processor (ASP) and data acquisition (DAQ) board.

FIG. 1 illustrates a system for acquiring data of a multi-channel SQUID signal using an ASP and a DAQ board.

Referring to FIG. 1, a system 100 for acquiring data of a multi-channel SQUID signal includes a SQUID sensor unit 110, an FLL circuit unit 120, conducting lines 130, an ASP 150, a filter 160, DAQ boards 170, and a computer 180.

The SQUID sensor unit 110 is disposed in a liquid helium Dewar 113 in a shield room 190, and 160 SQUID sensors operate therein. The FLL circuit unit 120 includes 10 FLL circuit modules 120-1 to 120-10. Each of the FLL circuit modules 120-1 to 120-10 includes 16 FLL circuits 121 and an output unit 123. The FLL circuits 121 amplify and linearize a signal measured by the SQUID sensor unit 110 in the shield room 190 and send the signal through the output unit 123 to the lines 130. The FLL circuits 121 are connected to the SQUID sensors respectively, and 16 FLL circuits 121 constitute one module. To drive the 160 SQUID sensors, the 10 FLL circuit modules 120-1 to 120-10, each having 16 channels, are required. The required number of lines 130 is 170, which amounts to the sum of the number of the SQUID sensors and the number of ground lines of the respective modules.

The ASP 150 is disposed in a shield room 140, and includes an analog signal processing module 151 and a direct current (DC) power supply 153. The analog signal processing module 151 includes a high-pass filter (HPF) 155, a voltage amplifier 156, a low-pass filter (LPF) 157, and a 60 Hz notch filter 158 for each channel. The ASP 150 receives the signal amplified and linearized in the FLL circuit unit 120 through the lines 130 and processes the received signal appropriately for MCG or MEG analysis. The DC power supply 153 is installed in the shield room 140 and prevents inflow of external noise.

The signal processed by the ASP 150 is sent to the plurality of DAQ boards 170 via the filter 160. The DAQ boards 170 convert the input analog signal into a digital signal and send the digital signal to the computer 180. When the 160 SQUID sensors are driven, two DAQ boards having an 80-channel voltage input or three DAQ boards having a 64-channel voltage input are used.

The computer 180 stores the digital signal or outputs a SQUID signal using application software.

In a system for acquiring data of a multi-channel SQUID signal using an ASP and DAQ board, SQUID sensors are connected to an ASP outside of a shield room containing the SQUID sensors through as many lines as the sum of the number of the SQUID sensors and the number of ground lines. This causes inflow of external noise into the shield room, and thus it is difficult to obtain accurate data. Also, the plurality of lines are combined with ground lines inside and outside the shield room to constitute a multi-loop circuit, which becomes another noise source.

Since a signal output from an FLL circuit unit has a low level, an analog signal processing system used to obtain only a required signal involves a high manufacturing cost and an increased installation area which becomes another noise source. Also, DAQ boards added to increase the number of voltage acquisition channels make loop circuits generating noise. Moreover, with increasing number of used channels, the sampling time of each channel is reduced.

SUMMARY OF THE INVENTION

The present invention is directed to providing a system for acquiring data of a multi-channel superconducting quantum interference device (SQUID) signal which does not cause inflow of external noise or generation of loop-circuit noise resulting from connection between a plurality of lines and ground lines, and does not require an analog signal processor (ASP).

One aspect of the present invention provides a system for acquiring data of a multi-channel SQUID signal including: a digital converter connected to a SQUID sensor having a plurality of channels, and configured to receive a voltage signal output from the plurality of channels and generate a channel-voltage serial digital signal having information about a channel from which the voltage signal is output and information about the voltage signal; and an optical fiber cable through which the channel-voltage serial digital signal is transmitted from the digital converter.

Another aspect of the present invention provides a system for acquiring data of a multi-channel SQUID signal including: a digital converter connected to a SQUID sensor having a plurality of channels, and including a plurality of digital conversion modules generating a channel-voltage serial digital signal having information about a channel from which a voltage signal output from the plurality of channels is output and information about the voltage signal from the voltage signal; and as many optical fiber cables as the digital conversion modules, the optical fiber cables transmitting the channel-voltage serial digital signal from the digital converter.

Still another aspect of the present invention provides a system for acquiring data of a multi-channel SQUID signal including: a digital converter disposed in a shield room blocking electromagnetic waves, connected to a SQUID sensor having a plurality of channels from which a voltage signal is output, and configured to receive the voltage signal output from the plurality of channels and generate a channel-voltage serial digital signal having information about a channel from which the voltage signal is output and information about the voltage signal; and an optical fiber cable through which the channel-voltage serial digital signal is transmitted from the digital converter out of the shield room.

Yet another aspect of the present invention provides a method of acquiring data of a multi-channel SQUID signal including: generating, from a voltage signal output from a SQUID sensor having a plurality of channels, a channel-voltage serial digital signal having information about a channel from which the voltage signal is output and information about the voltage signal in a shield room blocking electromagnetic waves; and transmitting the channel-voltage serial digital signal out of the shield room using an optical fiber cable.

BRIEF DESCRIPTION OF THE DRAWINGS

The above and other objects, features and advantages of the present invention will become more apparent to those of ordinary skill in the art by describing in detail exemplary embodiments thereof with reference to the attached drawings, in which.

DETAILED DESCRIPTION OF EXEMPLARY EMBODIMENTS

Hereinafter, exemplary embodiments of the present invention will be described in detail. However, the present invention is not limited to the embodiments disclosed below, but can be implemented in various forms. The following embodiments are described in order to enable those of ordinary skill in the art to embody and practice the present invention.

Although the terms first, second, etc. may be used to describe various elements, these elements are not limited by these terms. These terms are only used to distinguish one element from another. For example, a first element could be termed a second element, and, similarly, a second element could be termed a first element, without departing from the scope of exemplary embodiments. The term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The terminology used herein is for the purpose of describing particular embodiments only and is not intended to be limiting of exemplary embodiments. The singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, components and/or groups thereof, but do not preclude the presence or addition of one or more other features, integers, steps, operations, elements, components and/or groups thereof.

With reference to the appended drawings, exemplary embodiments of the present invention will be described in detail below. To aid in understanding the present invention, like numbers refer to like elements throughout the description of the figures, and the description of the same elements will be not reiterated.

Figure 2:
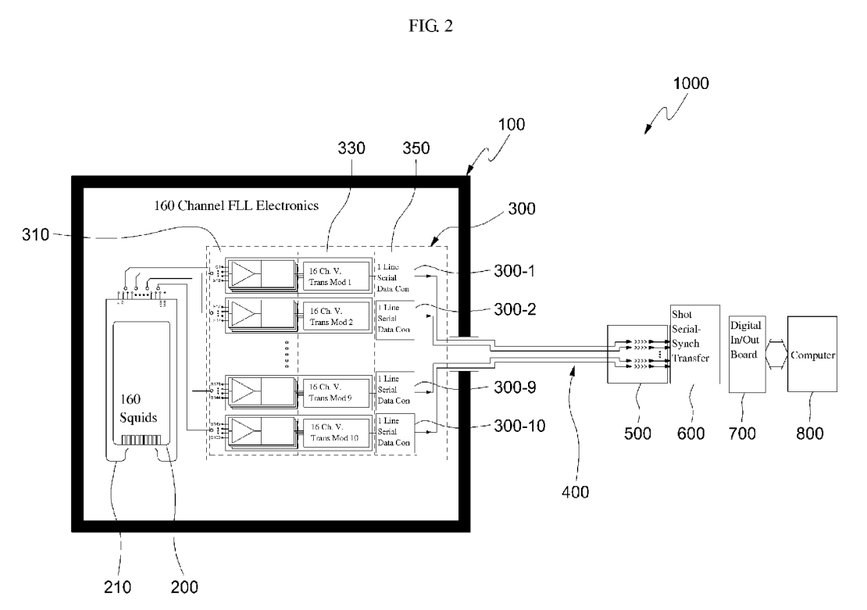
FIG. 2 is a block diagram of a system for acquiring data of a 160-channel SQUID signal according to an exemplary embodiment of the present invention.

FIG. 2 is a block diagram of a system 1000 for acquiring data of a 160-channel superconducting quantum interference device (SQUID) signal according to an exemplary embodiment of the present invention.

Referring to FIG. 2, the system 1000 for acquiring data of a 160-channel SQUID signal includes a shield room 100, a SQUID sensor 200, a digital converter 300, optical fiber cables 400, a channel-voltage receiver module 500, a shot serial-synchronized transfer module 600, a digital input/output (DIO) board 700, and a computer 800.

The SQUID sensor 200 has 160 channels, and is disposed in a liquid helium Dewar 210 placed in a shield room 100 to perform magnetocardiography (MCG) or magnetoencephalography (MEG) measurement on a human body and output a voltage signal. The shield room 100 may be a magnetically shielded room (MSR) or radio-frequency shielded room (RFSR).

The digital converter 300 includes ten digital conversion modules 300-1 to 300-10, and converts the voltage signal output from the SQUID sensor 200 into a serial digital signal having channel and voltage information.

Each of the digital conversion modules 300-1 to 300-10 includes 16 flux-locked loop (FLL)/high-pass filter (HPF)/amplifier (AMP) circuit modules 310, a channel-voltage transmission module 330, and a one-line serial data conversion module 350.

The FLL/HPF/AMP circuit modules 310 amplify and linearize the voltage signal output from the SQUID sensor 200 and send the amplified and linearized voltage signal to the channel-voltage transmission module 330. The channel-voltage transmission module 330 converts the amplified and linearized voltage signal into a serial digital signal having channel and voltage information. The one-line serial data conversion module 350 combines the serial digital signal having channel and voltage information with a clock signal to generate a channel-voltage serial short-pulse digital signal.

Ten optical fiber cables 400 are used for the 160-channel SQUID sensor 200 with the 10 digital conversion modules 300-1 to 300-10. Through the 10 optical fiber cables 400, the channel-voltage serial short-pulse digital signal is transmitted out of the shield room 100 to the channel-voltage receiver module 500. Here, the optical fiber cables 400 may have the same number as the digital conversion modules 300-1 to 300-10.

The channel-voltage receiver module 500 receives the channel-voltage serial short-pulse digital signal transmitted through the optical fiber cables 400, extracts the channel-voltage serial digital signal and the clock signal, and sends the extracted channel-voltage serial digital signal to the shot serial-synchronized transfer module 600.

The shot serial-synchronized transfer module 600 divides the channel-voltage serial digital signal according to time and rearranges the divided signals in sequence, thereby converting the channel-voltage serial digital signal into a channel-voltage parallel digital signal. The DIO board 700 receives and sends the channel-voltage parallel digital signal to the computer 800. The term "channel-voltage" denotes that both pieces of channel information and voltage information are included.

The computer 800 may have application software for acquiring data. The computer 800 receives and stores the channel-voltage digital signal, or extracts separately the channel information and the voltage information using the application software.

Figure 3:
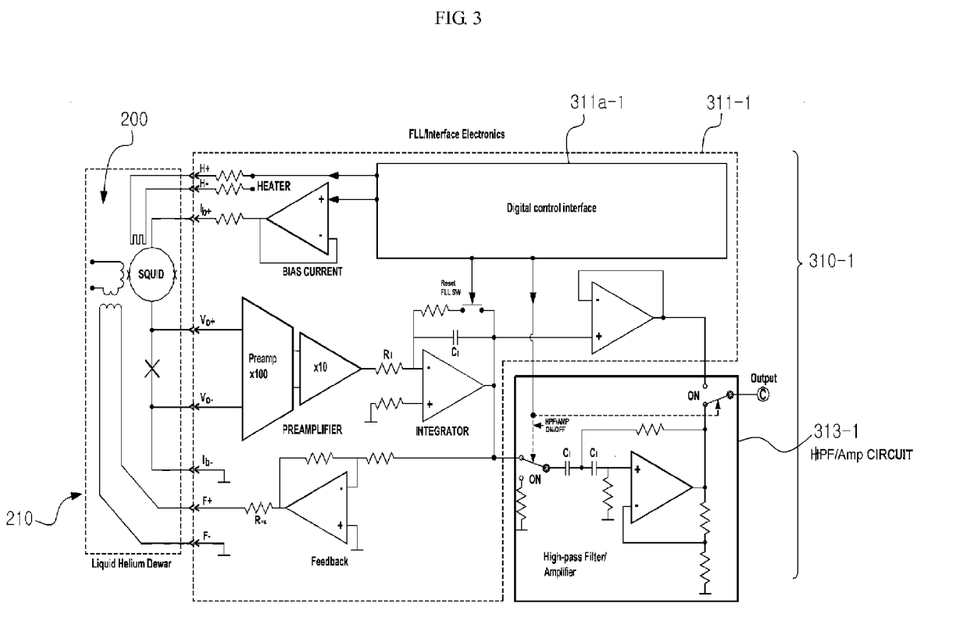
FIG. 3 is a block diagram of a flux-locked loop (FLL)/high-pass filter (HPF)/amplifier (AMP) circuit module according to an exemplary embodiment of the present invention.

FIG. 3 is a block diagram of an FLL/HPF/AMP circuit module according to the exemplary embodiment of the present invention.

Referring to FIG. 3, the SQUID sensor 200 receives current from the FLL/HPF/AMP circuit module 310-1 for operation, and sends a weak voltage signal to the FLL/HPF/AMP circuit module 310-1. The FLL/HPF/AMP circuit module 310-1 includes an FLL circuit module 311-1 and an HPF/AMP circuit module 313-1. The FLL/HPF/AMP circuit module 310-1 can be manufactured using one printed circuit board (PCB) with the FLL circuit module 311-1 and the HPF/AMP circuit module 313-1 thereon.

The FLL circuit module 311-1 includes a digital control interface module 311a-1, and linearizes a voltage signal output from the SQUID sensor 200. The FLL circuit module 311-1 can be controlled by a control signal output from a computer. The digital adjustment interface module 311a-1 outputs a switch control signal and a voltage control signal.

The HPF/AMP circuit module 313-1 may include one operational amplifier op-amp, and removes a direct current (DC) offset of the voltage signal output from the FLL circuit module 311-1 and amplifies the voltage signal. When the HPF/AMP circuit module 313-1 is operated, the output signal of the FLL circuit module 311-1 can be amplified about 100 times through an HPF. The FLL/HPF/AMP circuit module 310-1 can be manufactured by adding the HPF/AMP circuit module 313-1 to a FLL circuit installed on a PCB. The HPF/AMP circuit module 313-1 can operate as a part of an analog signal processor (ASP), and a low-pass filter (LPF) and a 60 Hz notch filter can be configured as software filters on a computer. The high-pass frequency and amplification rate of the HPF/AMP circuit module 313-1 can be determined according to the component value of a filter circuit.

Figure 4:
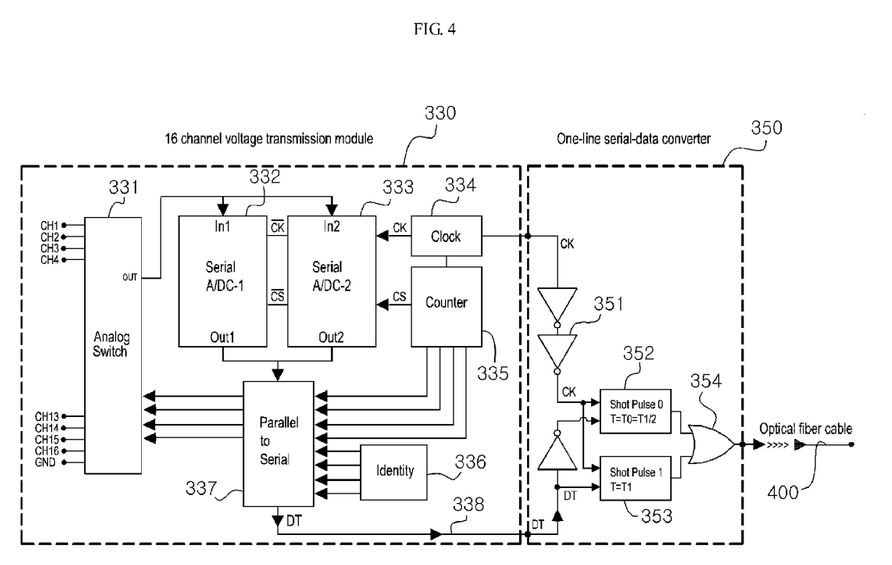
FIG. 4 is a block diagram of a channel-voltage transmission module and a one-line serial data conversion module according to an exemplary embodiment of the present invention.

FIG. 4 is a block diagram of a channel-voltage transmission module and a one-line serial data conversion module according to an exemplary embodiment of the present invention.

Referring to FIG. 4, the channel-voltage transmission module 330 includes an analog switch 331, a first analog-to-digital converter (ADC) 332, a second ADC 333, a clock generator 334, a counter 335, a module identifier 336, and a parallel-to-serial converter 337, and converts an amplified and linearized voltage signal into a serial digital signal having channel and voltage information.

The analog switch 331 sequentially selects 16 channels of the SQUID sensor 200, and sends a voltage signal output from the selected channel alternately to the first ADC 332 and the second ADC 333.

The first ADC 332 and the second ADC 333 convert the voltage signal output from the selected channel of the SQUID sensor 200 into a serial digital signal. While the first ADC 332 reads the voltage of the input voltage signal, the second ADC 333 converts a voltage read from the previous channel into a digital signal. Since an ADC is constituted of the first ADC 332 and the second ADC 333, it is possible to reduce the time to digitize a voltage signal of each channel by half.

The clock generator 334 and the counter 335 output a clock signal and synchronization signal for operation of the first ADC 332 and the second ADC 333, sends the clock signal and synchronization signal to the first ADC 332 and the second ADC 333, and sends a 4-bit parallel digital signal, which is an analog switch operation signal causing the analog switch 331 to select a channel, to the parallel-to-serial converter 337.

The module identifier 336 generates and sends a module identification signal, which is a 4-bit digital signal enabling identification of respective digital conversion modules, to the parallel-to-serial converter 337.

The parallel-to-serial converter 337 converts the analog switch operation signal and the module identification signal into serial signals, and combines the converted analog switch operation signal and the converted module identification signal with the serial digital signal output from the first ADC 332 and the second ADC 333, thereby generating a channel-voltage serial digital signal. When the first ADC 332 and the second ADC 333 have a 16-bit resolution, a 24-bit channel-voltage serial digital signal is output.

The one-line serial data conversion module 350 includes a delayer 351, a first short-pulse generator 352, a second short-pulse generator 353, and an OR gate 354, and combines the channel-voltage serial digital signal output from the channel-voltage transmission module 330 with the clock signal.

The delayer 351 synchronizes the channel-voltage serial digital signal with the clock signal output from the clock generator 334.

The first short-pulse generator 352 and the second short-pulse generator 353 output a short-pulse signal having a duration varying according to the channel-voltage serial digital signal, and send it to the OR gate 354. Using the clock signal, the first short-pulse generator 352 generates a pulse signal having a duration of $T_0$ when the channel-voltage serial digital signal is low, and a pulse signal having a duration of $2T_0$ when the channel-voltage serial digital signal is high.

The OR gate 354 combines the short-pulse signal output according to the channel-voltage serial digital signal with the channel-voltage serial digital signal to generate and transmit a channel-voltage serial short-pulse digital signal out of a shield room through the optical fiber cables 400.

Figure 5:
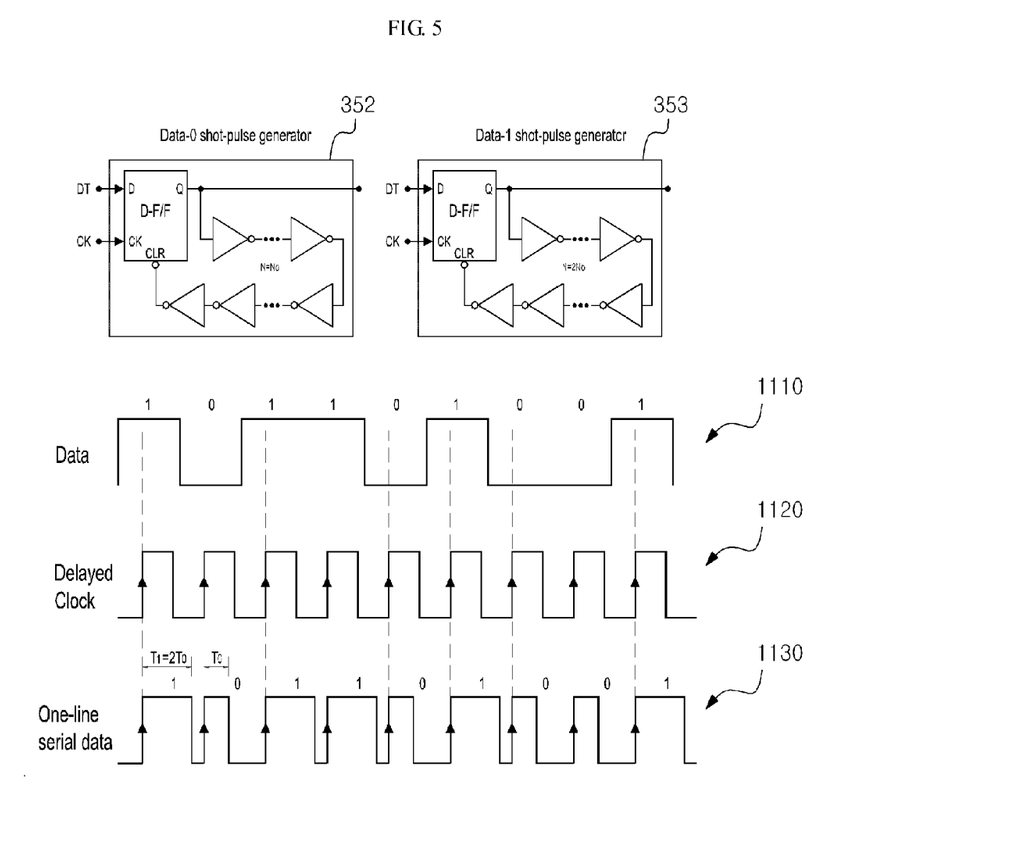
FIG. 5 illustrates generation of a channel-voltage serial short-pulse digital signal in a one-line serial data conversion module according to an exemplary embodiment of the present invention.

FIG. 5 illustrates generation of a channel-voltage serial short-pulse digital signal in a one-line serial data conversion module according to the exemplary embodiment of the present invention.

Referring to FIG. 5, when a clock signal 1120 is input while a channel-voltage serial digital signal 1110 is low, high data is input to a D flip-flop of the first short-pulse generator 352, and the output is kept high in proportion to the number of NOT gates and then goes low. The pulse duration is determined according to the output of the D flip-flop and the number of NOT gates connected to the clear terminal. However, when the channel-voltage serial digital signal 1110 is low, data is low at the second short-pulse generator 353, and the output does not respond to the clock signal 1120.

On the other hand, when the clock signal 1120 is input while the channel-voltage serial digital signal 1110 is high, high data is input to the D flip-flop of the second short-pulse generator 353, and the output is kept high in proportion to the number of NOT gates and then goes low. If the number of NOT gates in the second short-pulse generator 353 becomes $2N_0$, twice the number of NOT gates of the first short-pulse generator 352, $N_0$, the responding pulse duration doubles. When the channel-voltage serial digital signal 1110 is high, data of the first short-pulse generator 352 is low, and the output stays low without change.

The outputs of the first short-pulse generator 352 and the second short-pulse generator 353 are combined to generate a pulse having a duration of $2N_0$ when the channel-voltage serial digital signal 1110 is high, and a pulse having a duration of $N_0$ when the channel-voltage serial digital signal 1110 is low. The channel-voltage serial short-pulse digital signal is transmitted through the optical fiber cables 400 and then restored as the channel-voltage serial digital signal 1110 and the clock signal 1120 again.

Figure 6:
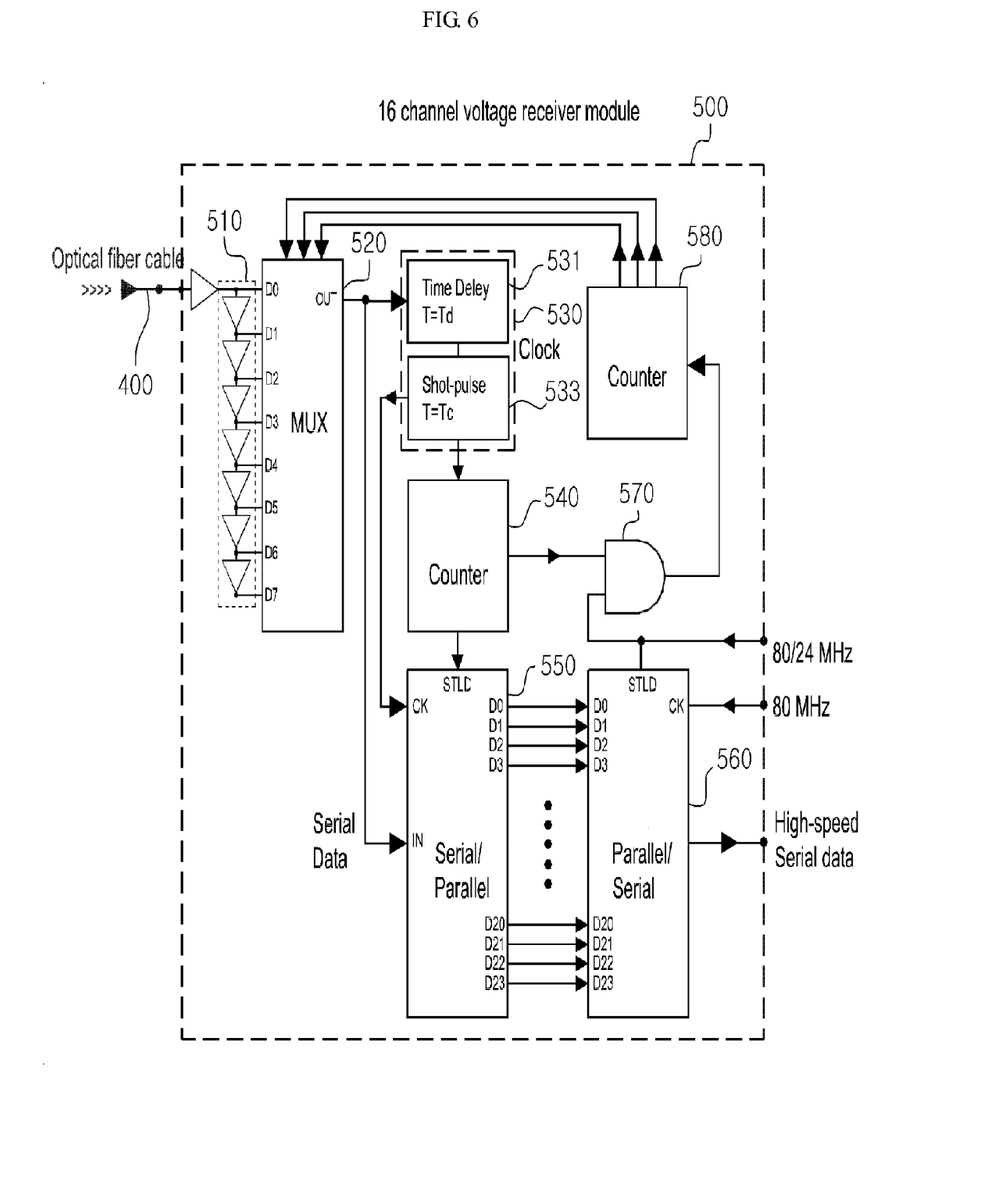
FIG. 6 is a block diagram of a channel-voltage receiver module according to an exemplary embodiment of the present invention.

FIG. 6 is a block diagram of a channel-voltage receiver module according to the exemplary embodiment of the present invention.

Referring to FIG. 6, the channel-voltage receiver module 500 includes a digital delayer 510, a multiplexer (MUX) 520, a clock recovery unit 530, a counter 540, a serial-to-parallel converter 550, a parallel-to-serial converter 560, and an AND gate 570.

The channel-voltage receiver module 500 receives a channel-voltage serial short-pulse digital signal transmitted through the optical fiber cables 400 and extracts a channel-voltage serial digital signal and a clock signal from the channel-voltage serial short-pulse digital signal. Subsequently, the channel-voltage receiver module 500 sends the extracted serial short-pulse digital signal to the shot serial-synchronized transfer module 600.

The channel-voltage serial short-pulse digital signal transmitted through the optical fiber cables 400 is sent to the clock recovery unit 530 via the digital delayer 510 and the MUX 520.

The clock recovery unit 530 includes a delayer 531 and a pulse generator 533. When the channel-voltage serial short-pulse digital signal passes through the delayer 531 and the pulse generator 533, the clock recovery unit 530 generates a channel-voltage serial digital signal 1230 and sends it to the serial-to-parallel converter 550 after a restored clock signal 1220 is generated. The counter 540 generates an output activation signal causing the serial-to-parallel converter 550 to convert a serial signal into a parallel signal and sends it to the serial-to-parallel converter 550. Hereinafter, a "serial signal" denotes a "channel-voltage serial digital signal," and a "parallel signal" denotes a "channel-voltage parallel digital signal."

When a 24-bit channel-voltage serial short-pulse digital signal is transmitted, the 24-bit counter 540 and the 24-bit serial-to-parallel converter 550 can be used. The serial-to-parallel converter 550 synchronizes the channel-voltage serial short-pulse digital signal to the output activation signal, thereby generating a channel-voltage parallel digital signal.

The parallel-to-serial converter 560 converts the channel-voltage parallel digital signal into a channel-voltage serial digital signal. The clock signal required for the parallel-to-serial converter 560 and the output activation signal causing a parallel signal to be converted into a serial signal are used in common in the channel-voltage receiver module 500 and the modules are synchronized with each other.

Since a driving clock signal of the serial-to-parallel converter 550 and a driving clock signal of the parallel-to-serial converter 560 separately operate, correct information cannot be acquired when a channel-voltage parallel digital signal of the serial-to-parallel converter 550 is changed while the parallel-to-serial converter 560 reads the channel-voltage parallel digital signal. A serial conversion stabilizer is configured such that the parallel-to-serial converter 560 stably performs parallel-to-serial conversion. The serial conversion stabilizer may include the delayer 531, the AND gate 570, and the counter 540.

When a serial signal is output as a parallel signal since the output activation signal of the serial-to-parallel converter 550 is kept high, and simultaneously, the parallel signal is read since an input activation signal of the parallel-to-serial converter 560 is kept high, the AND gate 570 outputs a high signal.

When the high signal of the AND gate 570 is responded in the counter 580 to operate the MUX 520, the digital delayer 510 passes a channel-voltage serial digital signal whose first delay has been selected. After the delay, the channel-voltage serial digital signal is input to the serial-to-parallel converter 550, and an output activation signal having a different time from a first output activation signal is generated to convert the serial signal into a parallel signal. When the AND gate 570 becomes low since the output activation signal of the serial-to-parallel converter 550 and the input activation signal of the parallel-to-serial converter 560 are not high at the same time, the parallel signal output from the serial-to-parallel converter 550 is stably converted into a serial signal. When the channel-voltage serial digital signal passed with the first delay does not make the AND gate 570 low, the channel-voltage serial digital signal is counted by the counter 540 and passed with a second delay. Counting is performed until the AND gate 570 becomes low, and the serial conversion stabilizer may be configured to have a maximum of eight delays.

The duration of the parallel signal output from the serial-to-parallel converter 550 is determined by the channel-voltage transmission module 330. When the channel-voltage digital signal has 24 bits and the clock frequency is $f_{ck-p}$, a duration $T_p$ is determined to be $24/f_{ck-p}$. Assuming that $f_{ck-p}$=5 MHz, $T_p$=4.8 µs. A time $T_s$ in which the parallel-to-serial converter 560 reads and converts the parallel signal into a serial signal is determined according to a clock time $f_{ck-s}$ and a parallel signal bit supplied in common to the channel-voltage receiver module 500, or according to the input activation signal. When a 24-bit parallel signal is read using a signal $f_{ck-s}$=80 MHz, converting time $T_s$=$24/f_{k-s}$=0.3 µs. The parallel-to-serial converter 560 converts the same channel-voltage parallel digital signal into a serial signal and outputs the serial signal 16 times during the parallel output duration $T_p$=4.8 µs of the serial-to-parallel converter 550. The channel-voltage receiver module 500 can be contained in one complex programmable logic device (CPLD), thereby saving the installation space and facilitating extension.

Figure 7:
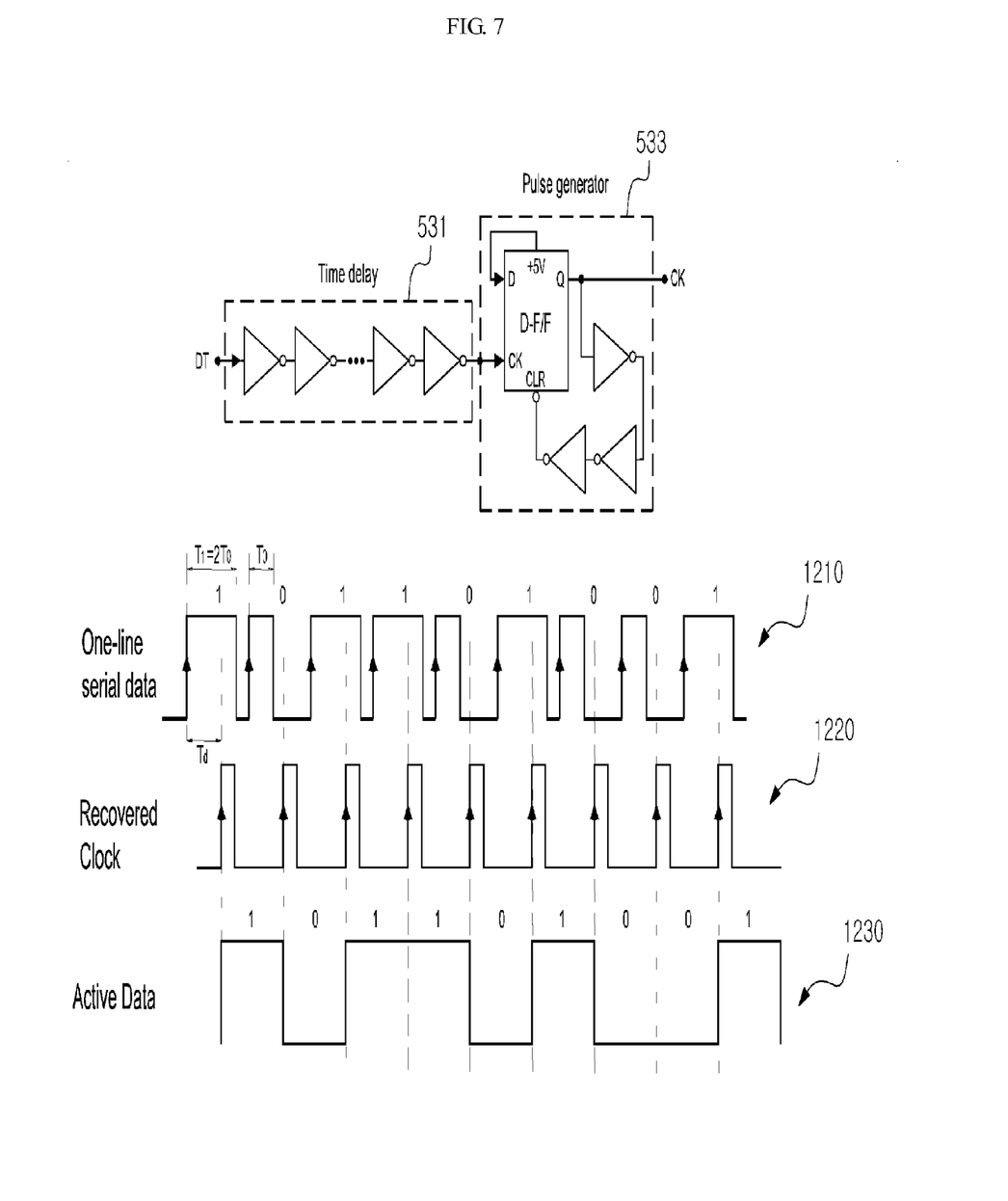
FIG. 7 illustrates generation of a channel-voltage serial digital signal in a channel-voltage receiver module according to an exemplary embodiment of the present invention.

FIG. 7 illustrates generation of a channel-voltage serial digital signal in a channel-voltage receiver module according to the exemplary embodiment of the present invention.

Referring to FIG. 7, when a channel-voltage serial short-pulse digital signal 1210 passes through the delayer 531 and the pulse generator 533, the channel-voltage serial digital signal 1230 is generated after the restored clock signal 1220.

The delayer 531 adjusts a delay using logical gates connected in series, and the pulse generator 533 generates a pulse signal using a D flip-flop. When a channel-voltage serial short-pulse digital signal is low, a delay $T_d$ of the delayer 531 is larger than the pulse duration $T_0$. On the other hand, when the channel-voltage serial short-pulse digital signal is high, the delay $T_d$ of the delayer 531 is smaller than the pulse duration $2T_0$.

Figure 8:
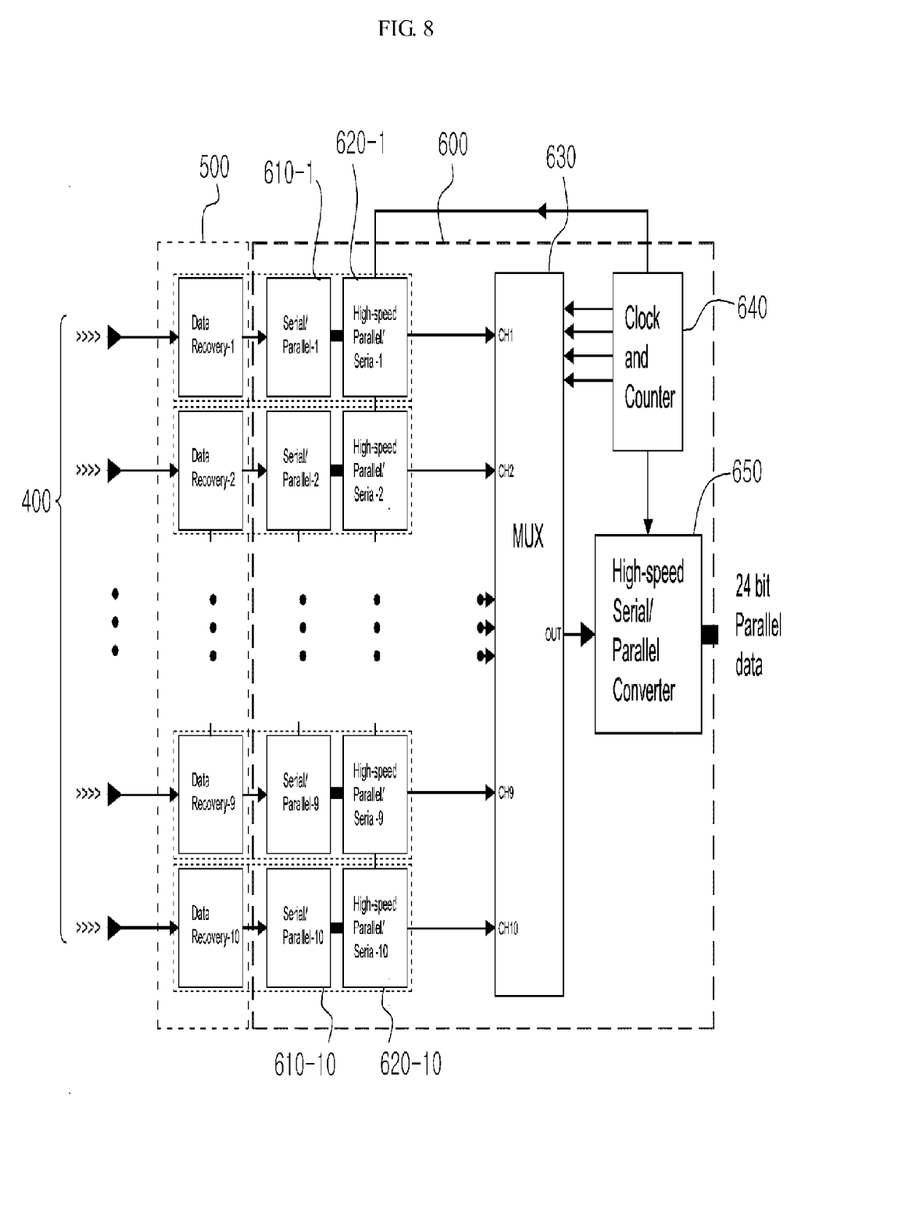
FIG. 8 is a block diagram of a channel-voltage receiver module and a shot serial-synchronized transfer module according to an exemplary embodiment of the present invention.

FIG. 8 is a block diagram of a channel-voltage receiver module and a shot serial-synchronized transfer module according to the exemplary embodiment of the present invention.

Referring to FIG. 8, the shot serial-synchronized transfer module 600 includes a serial-to-parallel converter 610-1, a parallel-to-serial converter 620-1, a module selector 630, a clock generator/counter 640, and a serial-to-parallel converter 650.

The serial-to-parallel converter 610-1 receives a channel-voltage serial digital signal from a channel-voltage receiver module and converts it into a channel-voltage parallel digital signal.

The parallel-to-serial converter 620-1 receives the channel-voltage parallel digital signal and converts it into a channel-voltage serial digital signal, and sends the channel-voltage serial digital signal to the module selector 630.

The module selector 630 consists of a digital MUX, and the number of channels is determined according to the number of channel-voltage receiver modules. When a voltage signal is received through 160 channels, 10 modules are included, and thus the module selector 630 consists of a 10-channel MUX.

The clock generator/counter 640 generates and sends a MUX selection signal to the module selector 630. The serial-to-parallel converter 650 generates a synchronized channel-voltage parallel digital signal.

Figure 9:
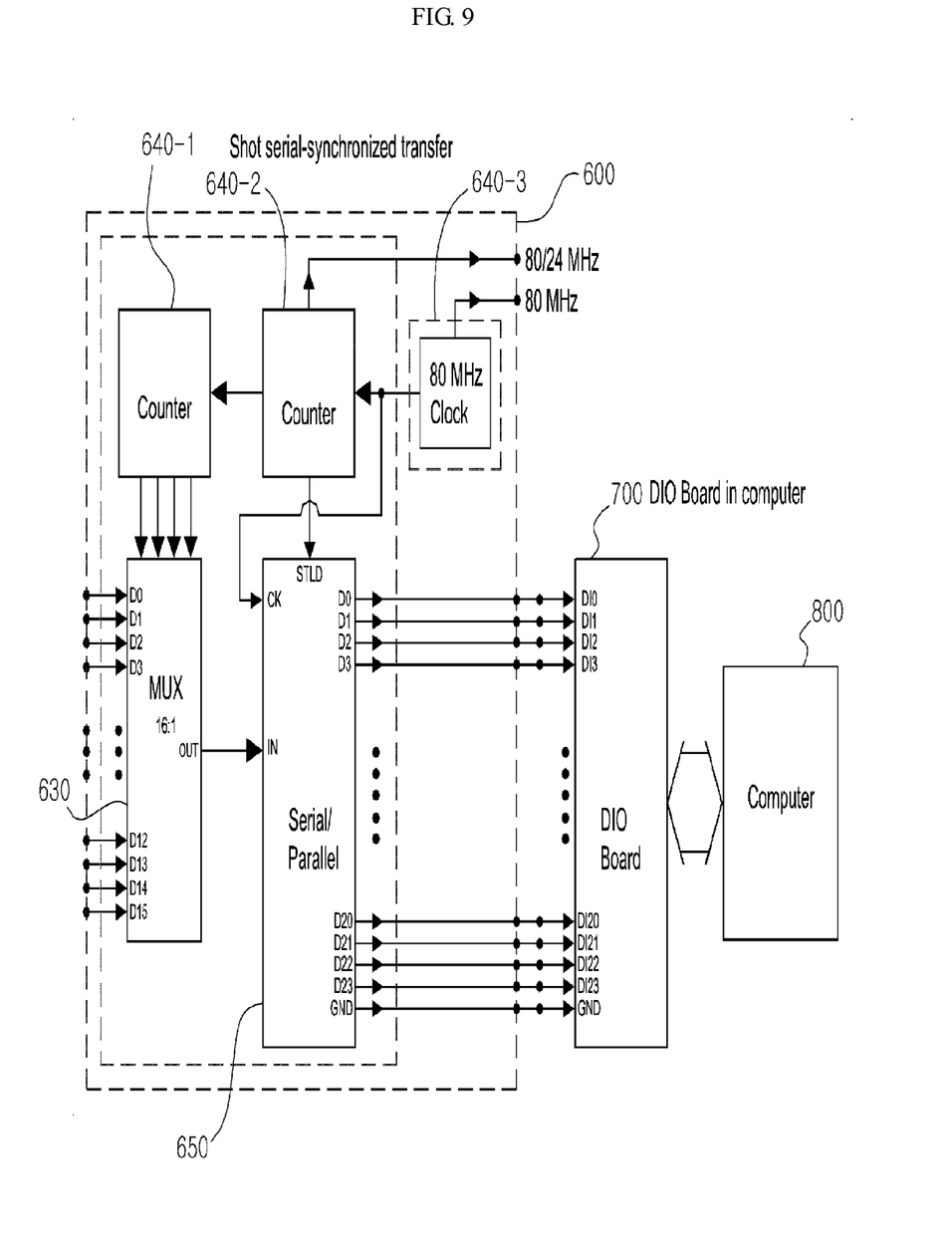
FIG. 9 is a block diagram of a shot serial-synchronized transfer module, a digital input/output (DIO) board, and a computer according to an exemplary embodiment of the present invention.

FIG. 9 is a block diagram of a shot serial-synchronized transfer module, a DIO board, and a computer according to the exemplary embodiment of the present invention.

Referring to FIG. 9, when the module selector 630 in the shot serial-synchronized transfer module 600 receives a channel-voltage serial digital signal in sequence, the serial-to-parallel converter 650 converts it into a channel-voltage parallel digital signal.

The clock generator 640-3 generates a clock signal and sends it to the shot serial-synchronized transfer module 600. Two counters 640-1 and 640-2 generate a selection signal required for the module selector 630.

When the channel-voltage digital signal has 24 bits, the clock signal with the 24-bit counter 640-2 is used as an activation signal and again the clock signal with the 4-bit counter 640-1 is used as a selection signal of the module selector 630. The clock signal and a counter signal are supplied in common to the shot serial-synchronized transfer module 600, thereby synchronizing signals with each other.

The module selector 630 divides the channel-voltage serial digital signal according to time, and one of the 16 same channel-voltage serial digital signals output from respective modules is sent to the serial-to-parallel converter 650 via the module selector 630. The shot serial-synchronized transfer module 600 excluding the clock generator 640-3 can be contained in one CPLD, resulting in simple manufacturing.

The channel-voltage parallel digital signal output from the shot serial-synchronized transfer module 600 is input to a computer via a DIO board.

While the same channel-voltage serial digital signal is output 16 times, the shot serial-synchronized transfer module 600 reads it only once, converts it into a parallel signal, and sequentially receives channel-voltage serial digital signals of other modules and converts them into parallel signals. Since channels of each module are read in a time-division manner and output, reading and conversion of 16 channel signals of one module takes the same amount of time taken for reading of 256 channels of 16 modules.

Figure 10:
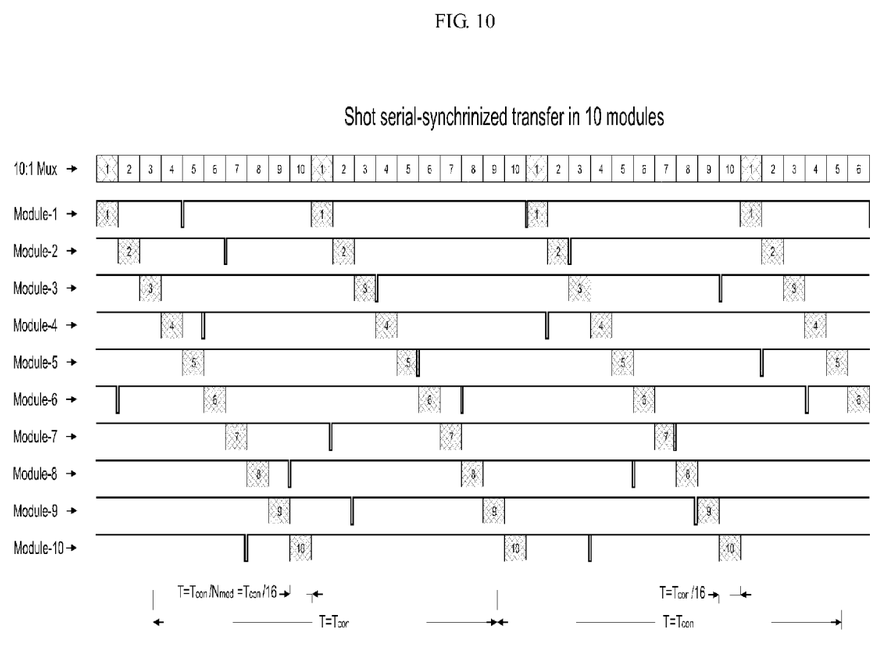
FIG. 10 illustrates time division of 10 modules for synchronization in a shot serial-synchronized transfer module according to an exemplary embodiment of the present invention.

FIG. 10 illustrates time division of 10 modules for synchronization in a shot serial-synchronized transfer module according to the exemplary embodiment of the present invention.

FIG. 10 illustrates serial signals of the respective modules passed through module selectors when there are 10 channel-voltage receiver modules.

When a maximum number of modules Nmod is 16, respective outputs of parallel-to-serial converters of the respective modules pass through the 16:1 module selector 630 once during a conversion time $T_{con}$ of the first ADC 332 and the second ADC 333 or the duration $T_p$ of the serial-to-parallel converter 650. The output of the same parallel-to-serial converters 620 can pass through the 10:1 module selector 630 once or twice during $T_p$.

A channel-voltage digital signal of the same channel may be sent two times, but the channel-voltage digital signals are considered as one when they are read by a computer using application software. A DIO board installed in the computer reads a channel-voltage parallel digital signal, which is the output of the shot serial-synchronized transfer module 600, at once. And a 24-bit channel-voltage digital signal is received by a DIO board having 24 digital input ports.

When the clock time $f_{ck\text{-}s}$ of the shot serial-synchronized transfer module 600 is 80 MHz and a 24-bit parallel digital signal is read, an input frequency $f_D$ of the 24-port DIO board needs to be $f_{ck\text{-}s}/24$ or more. When the clock time $f_{ck\text{-}s}$ of the shot serial-synchronized transfer module 600 is 80 MHz, a 24-bit digital signal needs to be read at $f_D$=80/24 MHz=3.33 MHz or more.

A channel-specific voltage is extracted from the channel-voltage digital signal sent to the computer and stored using application software, or the channel-voltage digital signal is processed by signal processing software.

In the exemplary embodiment, the above-described modules are separately implemented. However, some of the modules may be implemented as one integrated module, or each may be implemented as several modules.

Detailed values used above are merely intended to describe an exemplary embodiment of the present invention, and the present invention is not limited to these values.

All the above-described functions can be performed by processors, such as a microprocessor, a controller, a microcontroller, and an application-specific integrated circuit (ASIC), based on software, a program code, etc. coded to perform these functions. Design, development, and implementation of the code are apparent to those of ordinary skill in the art on the basis of the description of the present invention.

The above-described system and method for acquiring data of a multi-channel signal according to an exemplary embodiment of the present invention do not cause inflow of external noise or generation of loop-circuit noise resulting from connection between a plurality of lines and ground lines, and thus accurate data can be acquired. Also, since an analog signal processing (ASP) is not required, the present invention simplifies the constitution, reduces production cost, and prevents noise from being generated by a loop circuit between an ASP and a DAQ board.

Since one DIO board receives signals of all channels, it is not necessary to add a DIO board up to 256 channels, and also measurement sampling time is not reduced up to 256 channels. Further, since the same software filter is used for all channels, signal-processed outputs have the same characteristic, and uniformity is ensured in signal processing.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A system for acquiring data of a multi-channel superconducting quantum interference device (SQUID) signal, comprising:
a digital converter connected to a SQUID sensor having a plurality of channels, and configured to receive a voltage signal output from the plurality of channels and generate a channel-voltage serial digital signal having information about the channel from which the voltage signal is output and information about the voltage signal; and
an optical fiber cable through which the channel-voltage serial digital signal is transmitted from the digital converter;
wherein the digital converter is further configured to:
sequentially select the plurality of channels of the SQUID sensor;
convert a voltage signal output from the selected channel into a serial digital signal;
generate a serial signal to select the channel; and
combine the serial digital signal with the serial signal to generate the channel-voltage serial digital signal.

2. The system of claim 1, wherein the SQUID sensor and the digital converter are disposed in a shield room blocking electromagnetic waves.

3. The system of claim 1, wherein the digital converter includes:
a flux-locked loop (FLL)/high-pass filter (HPF)/amplifier (AMP) circuit module configured to amplify and linearize the voltage signal output from the plurality of channels of the SQUID sensor; and
a channel-voltage transmission module configured to convert the amplified and linearized voltage signal into the channel-voltage serial digital signal.

4. The system of claim 3, wherein the FLL/HPF/AMP circuit module includes:
an FLL circuit module configured to linearize the voltage signal output from the plurality of channels of the SQUID sensor; and
an HPF/AMP circuit module configured to remove a direct current (DC) offset of the linearized voltage signal and amplify the voltage signal.

5. The system of claim 1, further comprising a shot serial-synchronized transfer module configured to divide the channel-voltage serial digital signal according to time and sequentially convert the divided signals into a channel-voltage parallel digital signal.

6. The system of claim 5, further comprising a computer configured to store the channel-voltage parallel digital signal or generate the information about the channel through which the voltage signal is output from the channel-voltage parallel digital signal and the information about the voltage signal.

7. A system for acquiring data of a multi-channel superconducting quantum interference device (SQUID) signal, comprising:
a digital converter connected to a SQUID sensor having a plurality of channels, and including a plurality of digital conversion modules generating a channel-voltage serial digital signal having information about the channel through which a voltage signal output is output from the plurality of channels and information about the voltage signal; and
as many optical fiber cables as the digital conversion modules, the optical fiber cables transmitting the channel-voltage serial digital signal from the digital converter;
wherein the digital converter is configured to:
sequentially select the plurality of channels of the SQUID sensor;
convert a voltage signal output from the selected channel into a serial digital signal;
generate a first parallel digital signal to select the channel and a second parallel digital signal to identify the digital conversion modules;
convert the first parallel digital signal and the second parallel digital signal into serial signals, and
combine the serial digital signal with the serial signals to generate the channel-voltage serial digital signal.

8. The system of claim 7, wherein the digital conversion modules include:
a flux-locked loop (FLL)/high-pass filter (HPF)/amplifier (AMP) circuit module configured to amplify and linearize the voltage signal output from the plurality of channels of the SQUID sensor; and
a channel-voltage transmission module configured to convert the amplified and linearized voltage signal into the channel-voltage serial digital signal.

9. The system of claim 8, wherein the FLL/HPF/AMP circuit module includes:
an FLL circuit module configured to linearize the voltage signal output from the plurality of channels of the SQUID sensor; and
an HPF/AMP circuit module configured to remove a direct current (DC) offset of the linearized voltage signal and amplify the voltage signal.

10. The system of claim 8, wherein the channel-voltage transmission module includes:
an analog switch configured to sequentially select the plurality of channels of the SQUID sensor and alternately send a selected voltage signal to a first analog-to-digital converter (ADC) and a second ADC;
a clock generator configured to generate a first parallel digital signal causing the analog switch to select a channel;
a module identifier configured to generate a second parallel digital signal causing the digital converter to identify the digital conversion modules;
the first ADC configured to convert the selected voltage signal into a serial digital signal;
the second ADC configured to convert a voltage signal of the channel selected previously just before the currently selected channel into a serial digital signal while the first ADC reads the currently selected voltage signal; and
a parallel-to-serial converter configured to convert the first parallel digital signal and the second parallel digital signal into serial signals, and combine the serial digital signals with the serial signals to generate the channel-voltage serial digital signal.

11. The system of claim 7, further comprising a shot serial-synchronized transfer module configured to divide the channel-voltage serial digital signal according to time and sequentially convert the divided signals into a channel-voltage parallel digital signal.

12. The system of claim 11, further comprising a computer configured to store the channel-voltage parallel digital signal or generate the information about the channel through which the voltage signal is output from the channel-voltage parallel digital signal and the information about the voltage signal.

13. A system for acquiring data of a multi-channel superconducting quantum interference device (SQUID) signal, comprising:
a digital converter disposed in a shield room blocking electromagnetic waves, connected to a SQUID sensor having a plurality of channels from which a voltage signal is output, and configured to receive the voltage signal output from the plurality of channels and generate a channel-voltage serial digital signal having information about a channel from which the voltage signal is output and information about the voltage signal; and
an optical fiber cable through which the channel-voltage serial digital signal is transmitted from the digital converter out of the shield room;
wherein the digital converter is configured to:
sequentially select the plurality of channels of the SQUID sensor;
convert a voltage signal output from the selected channel into a serial digital signal;
generate a serial signal to select the channel, and
combine the serial digital signal with the serial signal to generate the channel-voltage serial digital signal.

14. The system of claim 13, wherein the digital converter includes:
a flux-locked loop (FLL)/high-pass filter (HPF)/amplifier (AMP) circuit module configured to amplify and linearize the voltage signal output from the plurality of channels of the SQUID sensor; and
a channel-voltage transmission module configured to convert the amplified and linearized voltage signal into the channel-voltage serial digital signal.

15. The system of claim 13, further comprising a shot serial-synchronized transfer module configured to divide the channel-voltage serial digital signal according to time and sequentially convert the divided signals into a channel-voltage parallel digital signal.

16. A method of acquiring data of a multi-channel superconducting quantum interference device (SQUID) signal, comprising:
generating, from a voltage signal output from a SQUID sensor having a plurality of channels, a channel-voltage serial digital signal having information about a channel from which the voltage signal is output and information about the voltage signal in a shield room blocking electromagnetic waves; and
transmitting the channel-voltage serial digital signal out of the shield room using an optical fiber cable;
wherein the step of generating comprises:
sequentially selecting the plurality of channels of the SQUID sensor;
converting a voltage signal output from the selected channel into a serial digital signal;
generating a serial signal to select the channel; and
combining the serial digital signal with the serial signal to generate the channel-voltage serial digital signal.

17. The method of claim 16, further comprising dividing the channel-voltage serial digital signal transmitted out of the shield room using the optical fiber cable according to time and sequentially converting the divided signals into a parallel digital signal.

18. A system for acquiring data of a multi-channel superconducting quantum interference device (SQUID) signal, comprising:
a digital converter connected to a SQUID sensor having a plurality of channels, and including a plurality of digital conversion modules generating a channel-voltage serial digital signal having information about the channel through which a voltage signal output is output from the plurality of channels and information about the voltage signal; and
as many optical fiber cables as the digital conversion modules, the optical fiber cables transmitting the channel-voltage serial digital signal from the digital converter;
wherein the digital conversion modules include:
a flux-locked loop (FLL)/high-pass filter (HPF)/amplifier (AMP) circuit module configured to amplify and linearize the voltage signal output from the plurality of channels of the SQUID sensor; and
a channel-voltage transmission module configured to convert the amplified and linearized voltage signal into the channel-voltage serial digital signal, the channel-voltage transmission module including:
an analog switch configured to sequentially select the plurality of channels of the SQUID sensor and alternately send a selected voltage signal to a first analog-to-digital converter (ADC) and a second ADC;
a clock generator configured to generate a first parallel digital signal causing the analog switch to select a channel;
a module identifier configured to generate a second parallel digital signal causing the digital converter to identify the digital conversion modules;
the first ADC configured to convert the selected voltage signal into a serial digital signal;
the second ADC configured to convert a voltage signal of the channel selected previously just before the currently selected channel into a serial digital signal while the first ADC reads the currently selected voltage signal; and
a parallel-to-serial converter configured to convert the first parallel digital signal and the second parallel digital signal into serial signals, and combine the serial digital signals with the serial signals to generate the channel-voltage serial digital signal.

* * * * *